US 8,248,066 B2

(12) United States Patent
Han

(10) Patent No.: US 8,248,066 B2
(45) Date of Patent: Aug. 21, 2012

(54) HALL INTEGRATED CIRCUIT WITH ADJUSTABLE HYSTERESIS

(75) Inventor: Dong-Ok Han, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 223 days.

(21) Appl. No.: 12/835,461

(22) Filed: Jul. 13, 2010

(65) Prior Publication Data

US 2011/0204888 A1 Aug. 25, 2011

(30) Foreign Application Priority Data

Feb. 25, 2010 (KR) .................. 10-2010-0017070

(51) Int. Cl.
  G01R 33/06 (2006.01)
  G01R 33/07 (2006.01)
  G01R 15/20 (2006.01)
(52) U.S. Cl. .................. 324/251; 324/117 H
(58) Field of Classification Search .......... 324/251, 324/117 H
See application file for complete search history.

(56) References Cited

U.S. PATENT DOCUMENTS 7,994,782 B2 * 8/2011 Takeda .................. 324/251

* cited by examiner

*Primary Examiner* — Roberto Velez
(74) *Attorney, Agent, or Firm* — McDermott Will & Emery LLP

(57) ABSTRACT

A Hall integrated circuit with adjustable hysteresis is disclosed. The circuit in accordance with an embodiment of the present invention includes a magnetic field-pulse convertor, which outputs a pulse-shaped voltage difference pulse by converting a change in two voltages as a pulse and in which the change occurs in accordance with a magnitude of a magnetic field inputted by a Hall sensor, a polarity determining unit, which determines polarities of two signals outputted by the Hall sensor by using the voltage difference pulse and one of the two signals outputted by the Hall sensor, a magnetic flux density determining unit, which outputs a high signal or a low signal by comparing the voltage difference pulse with a set value, and a first flip-flop outputs a result signal having a hysteresis characteristic according to inputs by the polarity determining unit and the magnetic flux density determining unit.

11 Claims, 13 Drawing Sheets

FIG. 6

| S | R | Q |
|---|---|---|
| 0 | 0 | latch |
| 0 | 1 | 0 |
| 1 | 0 | 1 |
| 1 | 1 | - |

FIG. 11

| R | D | Q |
|---|---|---|
| 0 | 0 | latch |
| 0 | 1 | latch |
| 1 | 0 | 0 |
| 1 | 1 | 1 |

HALL INTEGRATED CIRCUIT WITH ADJUSTABLE HYSTERESIS

CROSS-REFERENCE TO RELATED APPLICATIONS

This application claims the benefit of Korean Patent Application No. 10-2010-0017070, filed with the Korean Intellectual Property Office on Feb. 25, 2010, the disclosure of which is incorporated herein by reference in its entirety.

BACKGROUND

1. Technical Field

The present invention is related to a Hall integrated circuit with adjustable hysteresis.

2. Description of the Related Art

The Hall effect is a phenomenon that generates a voltage difference between two ends of a conductor due to the Lorentz force generated in a particular direction when a magnetic field is applied to the conductor, through which an electric current flows. A Hall sensor using the Hall effect has a shortcoming of readily being affected by temperatures or other environmental factors.

To overcome this shortcoming, the development of an integrated circuit having a supplementary circuit embedded therein is currently underway. A Hall integrated circuit having a supplementary circuit embedded in the Hall sensor is increasingly becoming smaller due to the development of new technologies. The Hall integrated circuit is not only used in automobiles and mobile phones but also applied in various devices such as laptop computers and digital appliances.

The Hall integrated circuit is manufactured in various forms, depending on the application. Particularly, Hall integrated circuits with a bipolar magnetic flux density characteristic are widely used.

The conventional Hall integrated circuit implements the bipolar characteristic by using an analog Schmitt trigger circuit after amplifying a signal detected by the Hall sensor using an amplifier. However, the analog circuit is greatly affected by its production environments and process changes, making the quality less reliable. As an effort to prevent this problem, a new Hall integrated circuit implemented as a digital substrate has been developed. Nevertheless, the circuit simply generates outputs in the form of on/off only, and hardly implements the bipolar characteristic.

SUMMARY

The present invention provides a Hall integrated circuit with adjustable hysteresis that has a digitally-based hysteresis magnetic characteristic.

An aspect of the present invention provides a Hall integrated circuit with adjustable hysteresis. In accordance with an embodiment of the present invention, the Hall integrated circuit with adjustable hysteresis can include a magnetic field-pulse converter, a polarity determining unit, a magnetic flux density determining unit and a first flip-flop. The magnetic field-pulse convertor outputs a pulse-shaped voltage difference pulse by converting a change in two voltages as a pulse, in which the change occurs in accordance with a magnitude of a magnetic field inputted by a Hall sensor, and the polarity determining unit determines polarities of two signals outputted by the Hall sensor by using the voltage difference pulse and one of the two signals outputted by the Hall sensor. The magnetic flux density determining unit outputs a high signal or a low signal by comparing the voltage difference pulse with a set value, and the first flip-flop outputs a result signal having a hysteresis characteristic according to inputs by the polarity determining unit and the magnetic flux density determining unit.

The Hall integrated circuit with adjustable hysteresis can further include a clock generator, which generates a clock signal. Here, the clock signal is supplied to at least one of the magnetic field-pulse convertor, the polarity determining unit and the magnetic flux density determining unit.

The magnetic field-pulse convertor can further include a first voltage output unit, a second voltage output unit and an XOR gate unit. The first voltage output unit outputs a voltage signal by using the clock signal and a first signal outputted by the Hall sensor, in which the voltage signal is charged in a first capacitor, and the second voltage output unit outputs a voltage signal by using the clock signal and a second signal outputted by the Hall sensor, in which the voltage signal is charged in a second capacitor. The XOR gate unit outputs the voltage signals inputted by the first voltage output unit and the second voltage output unit through an exclusive logical combination.

The XOR gate unit can output high during an input time difference between the voltage outputted by the first voltage output unit and the voltage outputted by the second voltage output unit.

The polarity determining unit can further include an AND gate and a second flip-flop. The AND gate performs an AND operation using the voltage outputted by the first voltage output unit and the voltage difference pulse, and the second flip-flop outputs a pulse having polarity information by receiving a signal outputted by the AND gate and a clock bar signal, in which the clock signal is inverted to the clock bar signal.

The magnetic flux density determining unit can further include a counter and a comparator. The counter counts the number of clocks of a reference clock signal within a pulsewidth of the voltage difference pulse by receiving the voltage difference pulse and the reference clock signal, and the comparator outputs a high signal or a low signal by comparing the number of counted clocks with the set value.

The magnetic flux density determining unit can further include a delay unit, which extends and outputs the pulsewidth of the voltage difference pulse if the pulsewidth of the voltage difference pulse is narrower than or equal to that of the reference clock signal.

The set value can have a first set value having an upper limit and a second set value having a lower limit.

The first set value and the second set value can have a same absolute value and have opposite polarities.

An absolute value of the set value can be selected within a predetermined range.

The Hall integrated circuit with adjustable hysteresis can further include an amplifier, which amplifies the signals outputted by the Hall sensor.

Additional aspects and advantages of the present invention will be set forth in part in the description which follows, and in part will be obvious from the description, or may be learned by practice of the invention.

BRIEF DESCRIPTION OF THE DRAWINGS

FIG. 6 is a truth table of an SR flip-flop shown in FIG. 4.

FIG. 11 is a truth table of a D flip-flop shown in FIG. 1.

DETAILED DESCRIPTION

Figure 1:
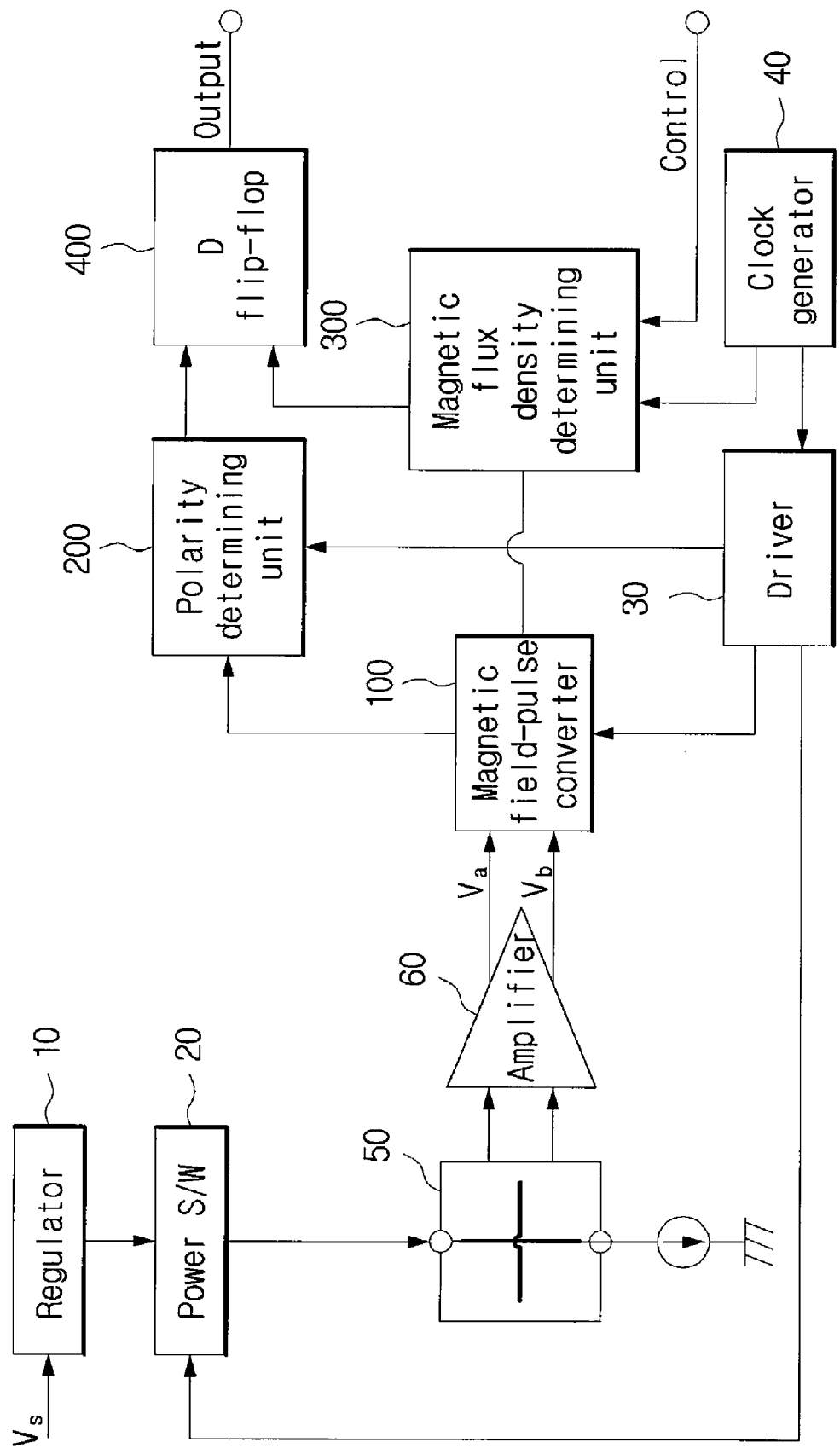
FIG. 1 is a block diagram of a Hall integrated circuit with adjustable hysteresis in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed descriptions of related art are omitted when it is deemed that they may unnecessarily obscure the essence of the invention.

While such terms as "first," "second," etc. may be used to describe various components, such components must not be limited to the above terms. The above terms are used only to distinguish one component from another.

When a component is mentioned to be "connected to" or "accessing" another component, this may mean that it is directly formed on or stacked on the other component, but it is to be understood that another component may exist in-between.

The features and advantages of this invention will become apparent through the below drawings and description.

FIG. 1 is a block diagram of a Hall integrated circuit with adjustable hysteresis in accordance with an embodiment of the present invention.

Referring to FIG. 1, the Hall integrated circuit with adjustable hysteresis in accordance with an embodiment of the present invention can include a regulator 10, a power switch 20, a Hall sensor 50, an amplifier 60, a driver 30, a clock generator 40, a magnetic field-pulse converter 100, a polarity determining unit 200, a magnetic flux density determining unit 300 and a first flip-flop 400.

Specifically, the regulator 10 supplies a constant voltage by rectifying an inputted voltage. The regulator 10 can use a circuit formed by a combination of a bridge circuit, a capacitor and a transistor, in order to supply a constant DC voltage.

The regulator 10 can increase or decrease the inputted voltage. The regulator 10 can increase or decrease the voltage by using a boost-up circuit or a boost-down circuit.

The Hall sensor 50 generates a voltage or electric current, based on the magnetic field of a magnet. The Hall sensor 50 can output the change in magnetic field as a voltage or electric current, in order to generate location information. The Hall sensor 50 can vary its output voltage or current in response to changes in magnetic flux density in correspondence with the position of the Hall sensor 50. The Hall sensor 50 can remove an offset generated by the Hall sensor 50 itself.

The power switch 20 can control on/off in accordance with the clock generated by the clock generator 40 in order to minimize the power consumption of the Hall sensor 50.

The amplifier 60 can amplify a signal inputted by the Hall sensor 50. The amplifier 60 can amplify and output the inputted signal in accordance with the gain of the amplifier 60 if the magnitude of the signal generated by the Hall sensor 50 is small.

The driver 30 can control the power switch 20. The driver 30 can provide a clock signal inputted by the clock generator 40 to the polarity determining unit 200.

The clock generator 40 can generate an internal clock and provide it to the driver 30 and the magnetic flux density determining unit 300.

The magnetic field-pulse converter 100 outputs a voltage difference pulse by using the difference in two voltages inputted by the amplifier 60. The magnetic field-pulse converter 100 can include a plurality of transistors, capacitors and logic circuits. The magnetic field-pulse converter 100 can output a pulse signal having a large pulse width if the voltage difference between the two inputted voltages is great, and can output a pulse signal having a small pulse width if the voltage difference between the two inputted voltages is small.

The polarity determining unit 200 can detect the polarity of the voltage difference pulse outputted by the magnetic field-pulse converter 100. Since the magnetic field-pulse converter 100 determines the pulsewidth solely by using the information on voltage difference, the magnetic field-pulse converter 100 cannot determine the polarities of two signals Va and Vb inputted by the Hall sensor 50. Accordingly, the polarity determining unit 200 can determine the polarities of the two signals Va and Vb inputted by the Hall sensor 50 by using the signal inputted from the magnetic field-pulse converter 100 and the clock signal inputted from the driver 30, and output the polarities to the first flip-flop 400.

The magnetic flux density determining unit 300 can output a pulse by using the voltage difference pulse Pout inputted by the magnetic field-pulse converter 100 and the clock signal CLK inputted by the clock generator 40. Here, the magnetic flux density determining unit 300 can output a high pulse if the magnitude of the magnetic field is greater than a set value and a low pulse if the magnitude of the magnetic field is lower than the set value.

The first flip-flop 400 can output a result having a hysteresis characteristic through signals inputted by the polarity determining unit 200 and the magnetic flux density determining unit 300.

Although this embodiment presents a D flip-flop as an example of the first flip-flop 400, it is also possible that an SR flip-flop or a T flip-flop, other than the D flip-flop, can be used for the first flip-flop 400.

Below, the Hall integrated circuit with adjustable hysteresis in accordance with an embodiment of the present invention will be described in more detail by referring to FIGS. 2 to 13.

Figure 2:
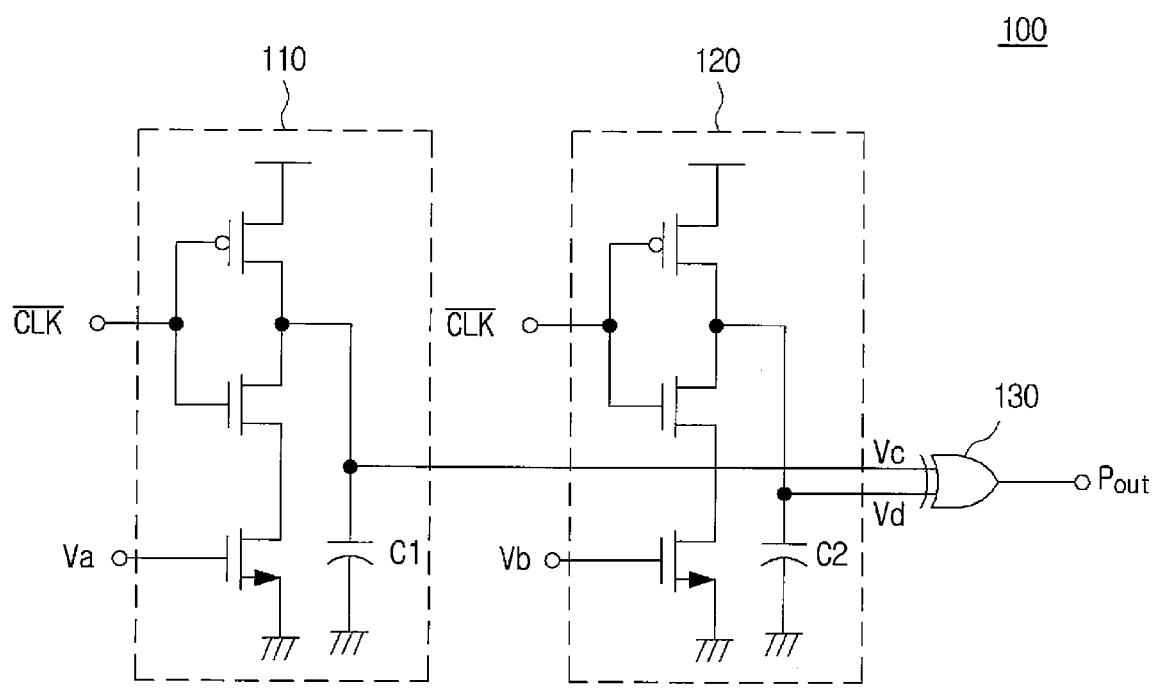
FIG. 2 is a circuit diagram illustrating an example of the magnetic field-pulse converter shown in FIG. 1.
Figure 3:
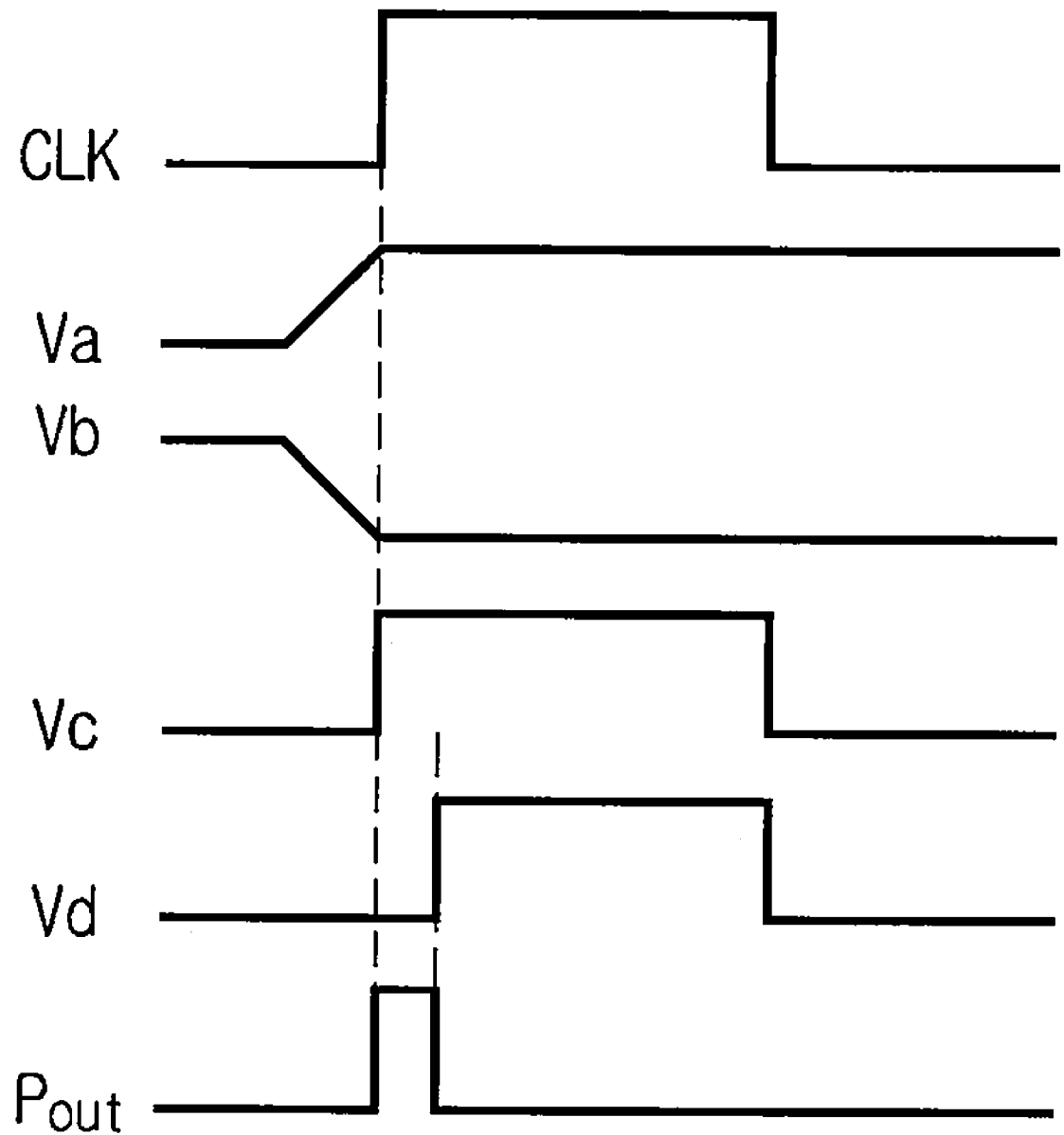
FIG. 3 is a waveform diagram illustrating input/output waveforms of the magnetic field-pulse converter shown in FIG. 2.

FIG. 2 is a circuit diagram illustrating an example of the magnetic field-pulse converter 100 shown in FIG. 1, and FIG. 3 is a waveform diagram illustrating input/output waveforms of the magnetic field-pulse converter 100 shown in FIG. 2.

Referring to FIGS. 2 and 3, the magnetic field-pulse converter 100 can include a first voltage output unit 110, a second voltage output unit 120 and an XOR gate unit 130.

Specifically, the first voltage output unit 110 can include a plurality of transistors. In one example, the first voltage output unit 110 can include two transistors that operate differently from the operation of on/off in accordance with the clock bar CLK signal $\overline{CLK}$, a transistor that is turned on/off in accordance with the first signal Va inputted by the amplifier 60, and a first capacitor C1, which outputs a charged voltage. Here, as illustrated in FIG. 3, the first voltage output unit 110 outputs a first voltage Vc in accordance with the value of the capacitor after elapsing a certain period of time if the first signal Va is high and the clock signal CLK is high.

The second voltage output unit 120 can include two transistors that operate CLK differently from the operation of on/off in accordance with the clock bar signal $\overline{CLK}$, a transistor that is turned on/off in accordance with the second signal Vb inputted by the amplifier 60, and a second capacitor C2, which outputs a charged voltage. Here, as illustrated in FIG. 3, the second voltage output unit 120 outputs a second voltage Vd in accordance with the value of the capacitor after elapsing a certain period of time if the second signal Vb is low and the clock signal CLK is high.

The XOR gate unit 130 can output a voltage difference pulse Pout by receiving the first voltage Vc and the second voltage Vd. Here, as illustrated in FIG. 3, the XOR gate unit 130 outputs a voltage difference pulse Pout in a section where the first voltage Vc is high and the second voltage Vd is low. Here, the voltage difference pulse Pout outputted by the XOR gate unit 130 is the difference in voltage between the first voltage Vc and the second voltage Vd inputted by the amplifier 60.

Figure 4:
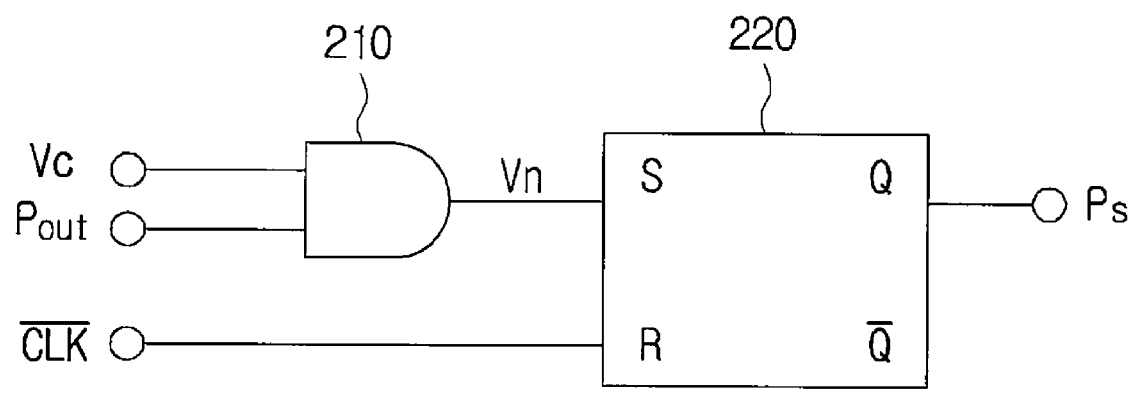
FIG. 4 is a circuit diagram illustrating an example of the polarity determining unit shown in FIG. 1.
Figure 5:
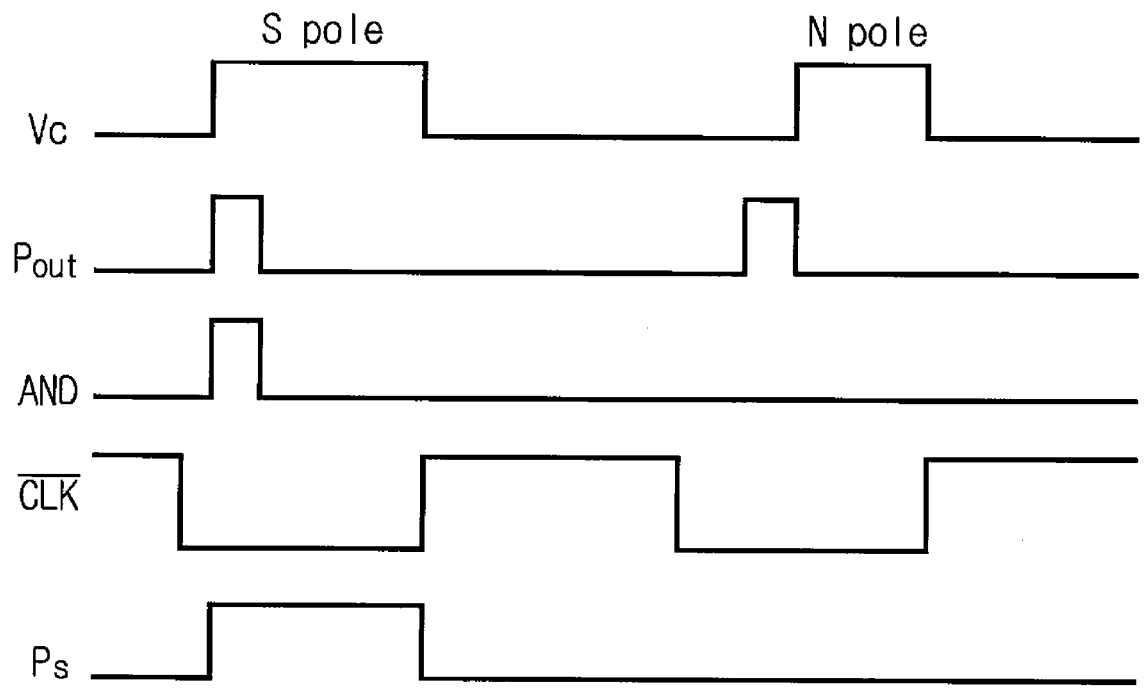
FIG. 5 is a waveform diagram illustrating input/output waveforms of the polarity determining unit shown in FIG. 4.
Figure 6:
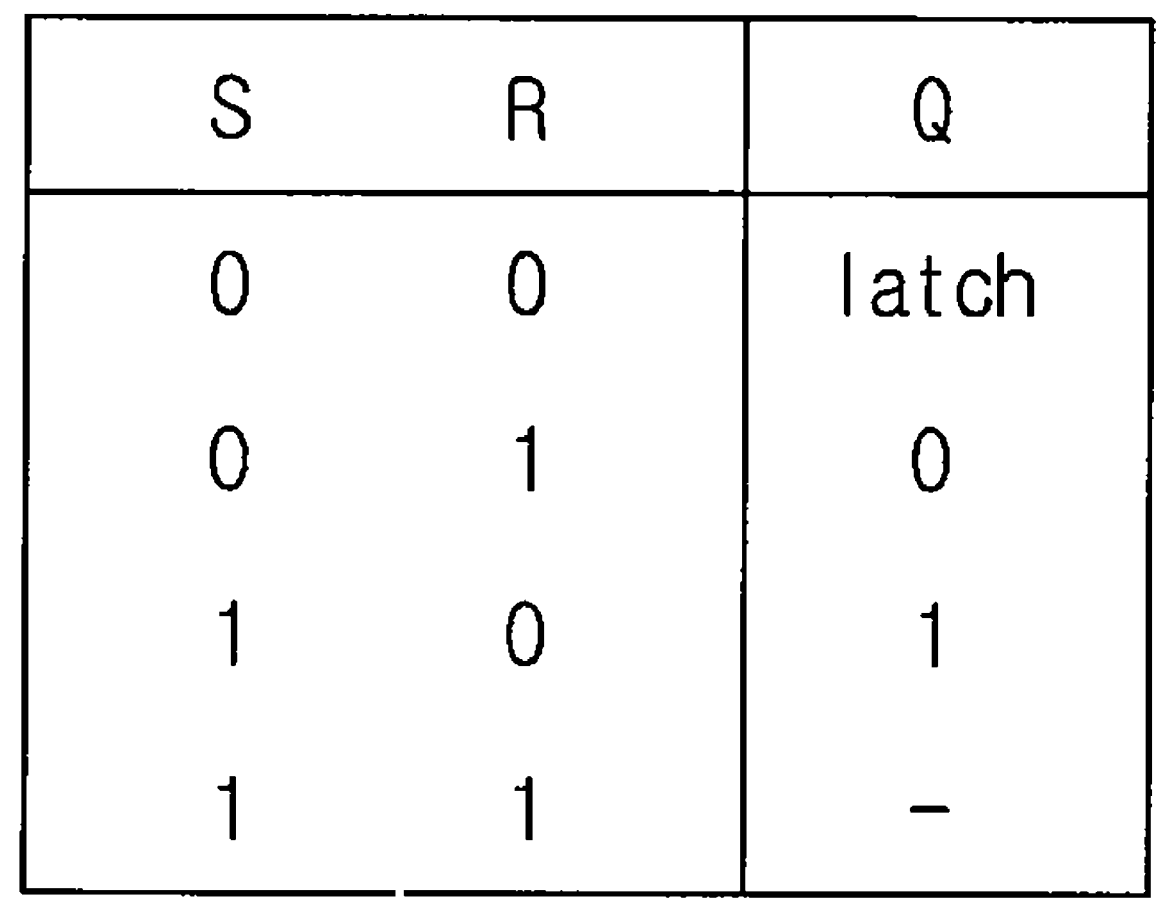

FIG. 4 is a circuit diagram illustrating an example of the polarity determining unit 200 shown in FIG. 1, and FIG. 5 is a waveform diagram illustrating input/output waveforms of the polarity determining unit 200 shown in FIG. 4. FIG. 6 is a truth table of an SR flip-flop shown in FIG. 4.

Referring to FIGS. 4 to 6, the polarity determining unit 200 can include an AND gate 210 and a second flip-flop 220.

The AND gate 210 performs an AND operation and outputs a signal by receiving the first voltage Vc and the voltage difference pulse Pout from the magnetic field-pulse converter 100. The AND gate 210 outputs a pulse if both the first voltage Vc and the voltage difference pulse Pout are high.

An SR flip-flop can be used for the second flip-flop 220. The second flip-flop 220 can output polarity information by receiving the clock bar signal $\overline{CLK}$ and a signal outputted by the AND gate 210. The second flip-flop 220 can output polarity information, like the table shown in FIG. 6. For example, the second flip-flop 220 outputs latch if the input is 00, outputs 0 or low if the input is 01, outputs 1 or high if the input is 10, and outputs nothing if the input is 11.

The second flip-flop 220 can output S polarity information if the output of the AND gate 210 is high and the clock bar signal is low.

Although this embodiment presents an SR flip-flop as an example of the second flip-flop 220, it shall be apparent that the present invention is not limited to this example, and a digital circuit having the same function as that of the SR flip-flop can be used for the second flip-flop 220.

Since the composition unit shown in FIG. 4 is formed in a dual form, the polarity information of N pole can be detected. Also, if the first voltage or the second voltage is selectively inputted to a front end part of the AND gate 210, the polarity information of S pole and N pole can be detected.

Figure 7:
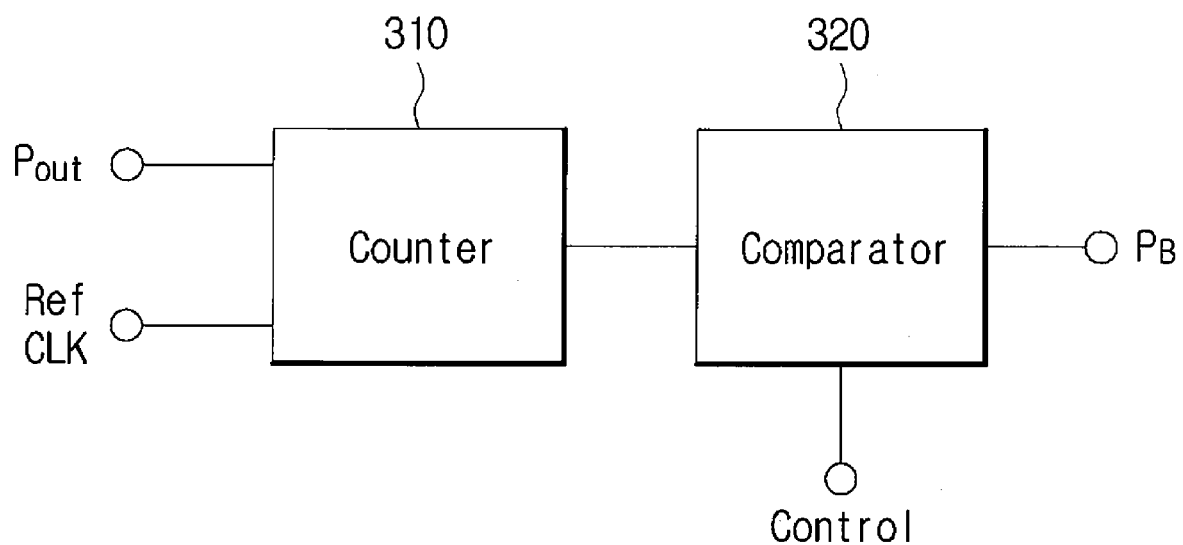
FIG. 7 is a block diagram illustrating an example of the magnetic flux density determining unit shown in FIG. 1.
Figure 8:
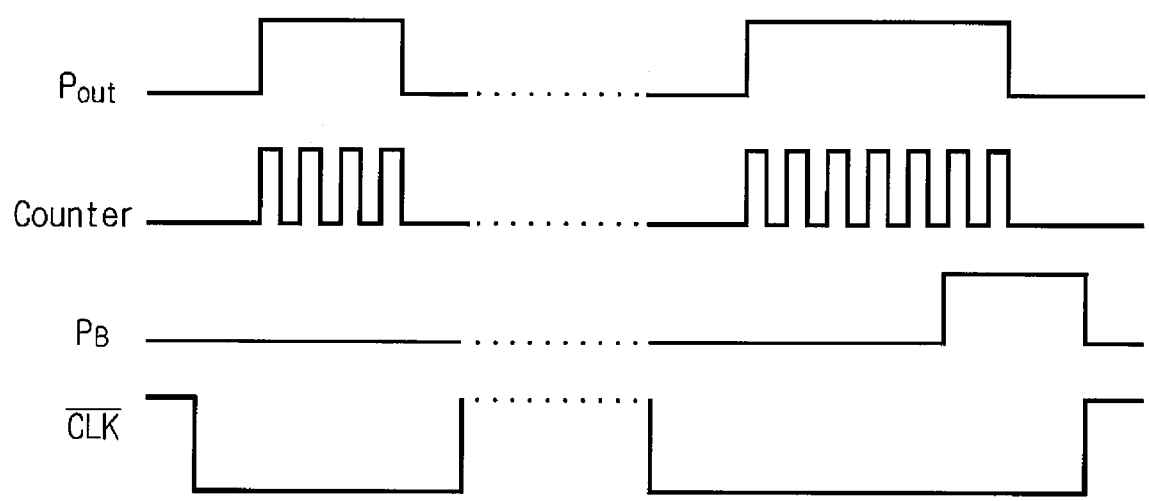
FIG. 8 is a waveform diagram illustrating input/output waveforms of the magnetic flux density determining unit shown in FIG. 7.

FIG. 7 is a block diagram illustrating an example of the magnetic flux density determining unit 300 shown in FIG. 1, and FIG. 8 is a waveform diagram illustrating input/output waveforms of the magnetic flux density determining unit 300 shown in FIG. 7.

Referring to FIGS. 7 and 8, the magnetic flux density determining unit 300 can include a counter 310 and a comparator 320.

Specifically, the counter 310 can count a reference clock Ref CLK in a section where the voltage difference pulse Pout is high by receiving the reference clock Ref CLK and the voltage difference pulse Pout from the magnetic field-pulse converter 100.

The comparator 320 compares a set value inputted by a control terminal Control and a counting signal inputted by the counter 310, and outputs high if the counting signal is wider than the set value and low if the counting signal is narrower than the set value. Here, the user can arbitrarily choose the set value inputted by the control terminal Control. In the present invention, the magnitude of the magnetic field to be detected can be controlled by the set value.

A digital comparator that outputs inputs/outputs as digital signals can be used for the comparator 320.

In case it is difficult for the counter 310 to generate a counting signal because the inputted voltage difference pulse Pout is small or the frequency of the reference clock Ref CLK is high, the magnetic flux density determining unit 300 can include an OR gate 350 and a delay unit 360 for easier counting.

Figure 9:
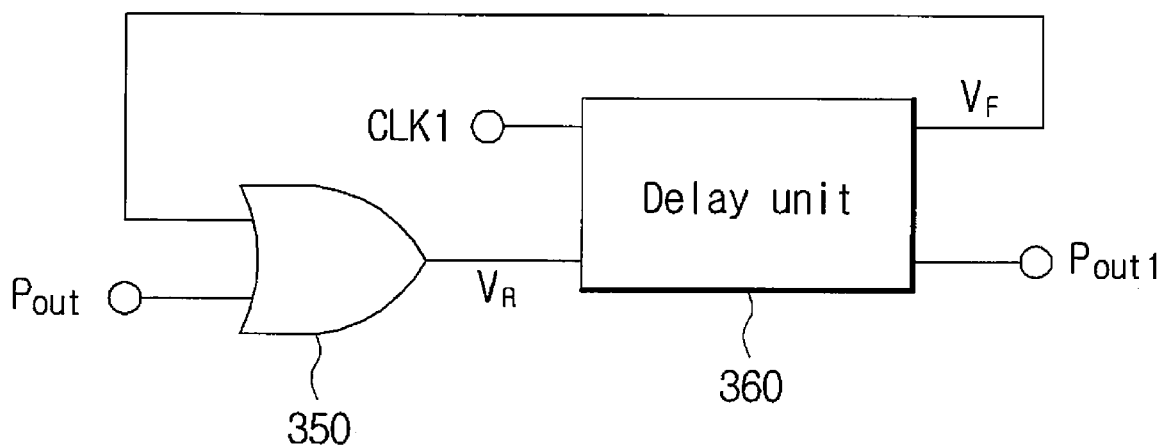
FIG. 9 is a block diagram illustrating another example of the magnetic flux density determining unit shown in FIG. 1.

As illustrated in FIG. 9, the OR gate 350 outputs a signal by receiving a feedback signal Vf provided by the delay unit 360 and the voltage difference pulse Pout. The delay unit 360 delays the signal inputted by the OR gate 350 for a certain period of time and then outputs it.

Figure 10:
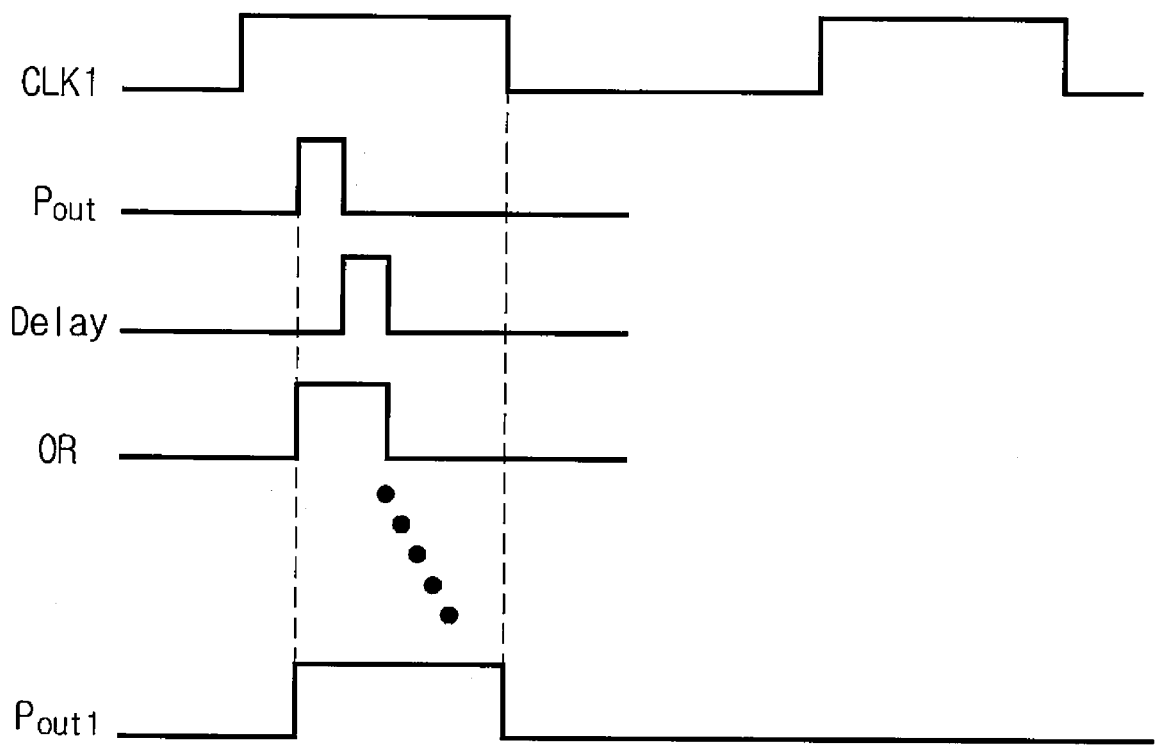
FIG. 10 is a waveform diagram illustrating input/output waveforms of the magnetic flux density determining unit shown in FIG. 9.

As illustrated in FIG. 9, once the voltage difference pulse Pout is inputted through the OR gate 350, the delay unit 360 delays the inputted voltage difference pulse Pout for a certain period of time and transmits the feedback signal Vf to the OR gate 350 again. The OR gate 350 performs an OR operation for the voltage difference pulse Pout and the feedback signal Vf and outputs a signal. The signal outputted by the OR gate 350 is applied to the delay unit 360 again to repeatedly feed back a signal. Here, the voltage difference pulse Pout1 outputted by the delay unit 360 can be determined by the reference clock Ref CLK inputted to the delay unit 360 or a clock signal CLK1 that is lower in frequency than the reference clock Ref CLK. As illustrated in FIG. 10, the voltage difference pulse Pout outputted by the OR gate 350 can be determined by synchronizing with the clock signal CLK1.

The magnetic flux density determining unit 300 can have at least two set values. In one example, the magnetic flux density determining unit 300 can have a first set value having an upper limit and a second set value having a lower limit.

Also, as illustrated in FIG. 5, the magnetic flux density determining unit 300 can have a set value for S pole and a set value for N pole. Here, the two set values can have a same absolute value.

Figure 11:
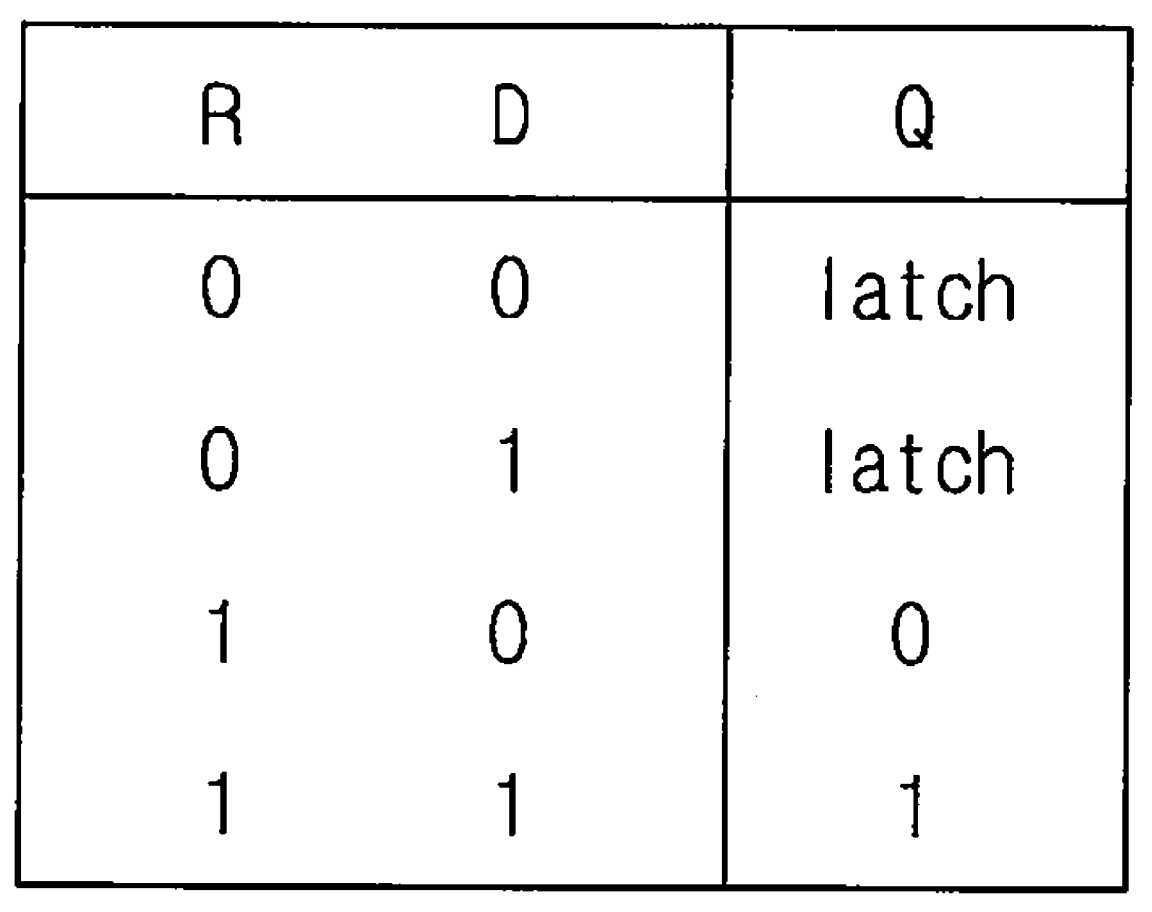
Figure 12:
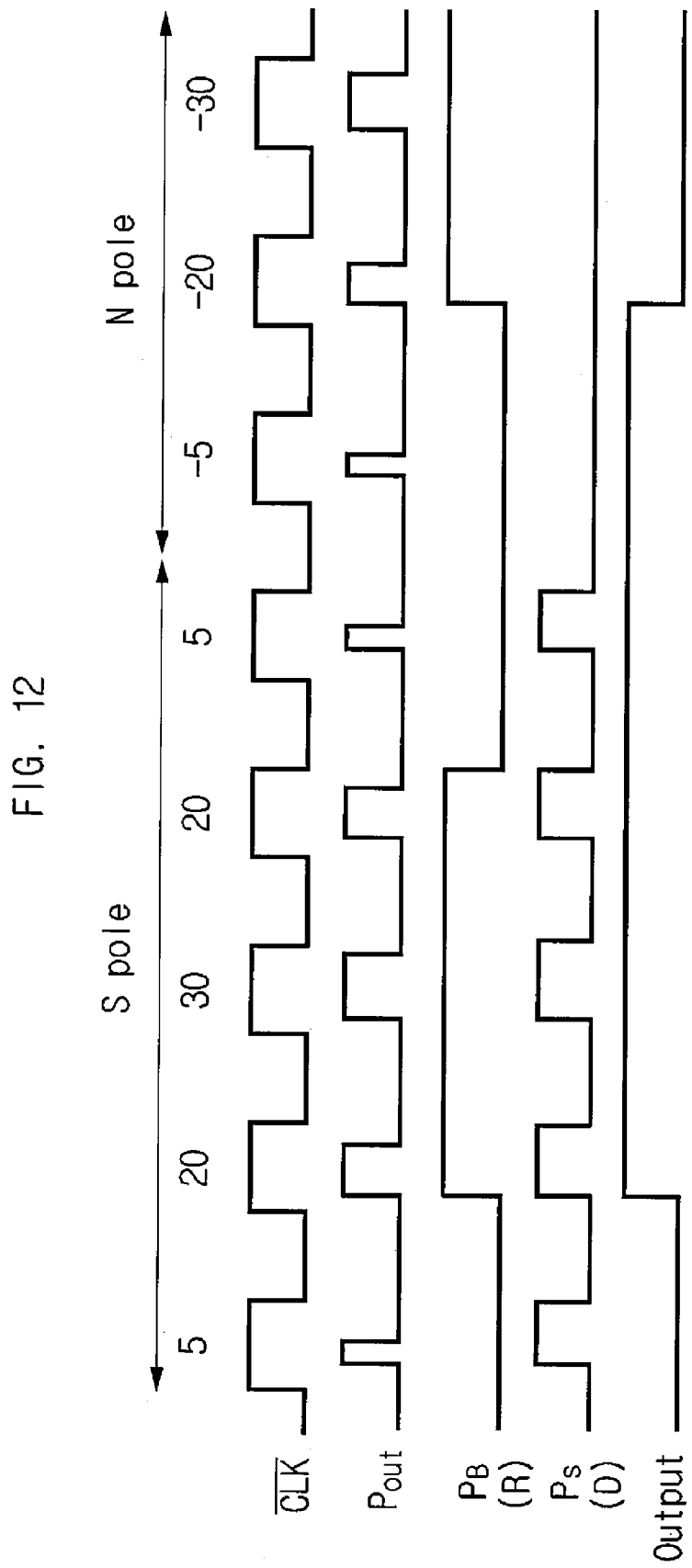
FIG. 12 is a waveform diagram illustrating the output of the Hall integrated circuit with adjustable hysteresis shown in FIG. 1.

FIG. 11 is a truth table of a D flip-flop shown in FIG. 1, and FIG. 12 is a waveform diagram illustrating the output of the Hall integrated circuit with adjustable hysteresis shown in FIG. 1.

As illustrated in FIGS. 11 and 12, the D flip-flop 400 can output 0 or 1 by using the input from the polarity determining unit 200 and the clock inputted by the magnetic flux density determining unit 300. The D flip-flop 400 starts to output high when the input of the polarity determining unit 200 is high and the clock inputted by the magnetic flux density determining unit 300 is high. Here, if the input by the polarity determining unit 200 maintains high, the D flip-flop 400 also maintains its output state even though low is inputted by the magnetic flux density determining unit 300. The output of the D flip-flop 400 can change from high to low when the output of the magnetic flux density determining unit 300 changes from 0 to 1.

Figure 13:
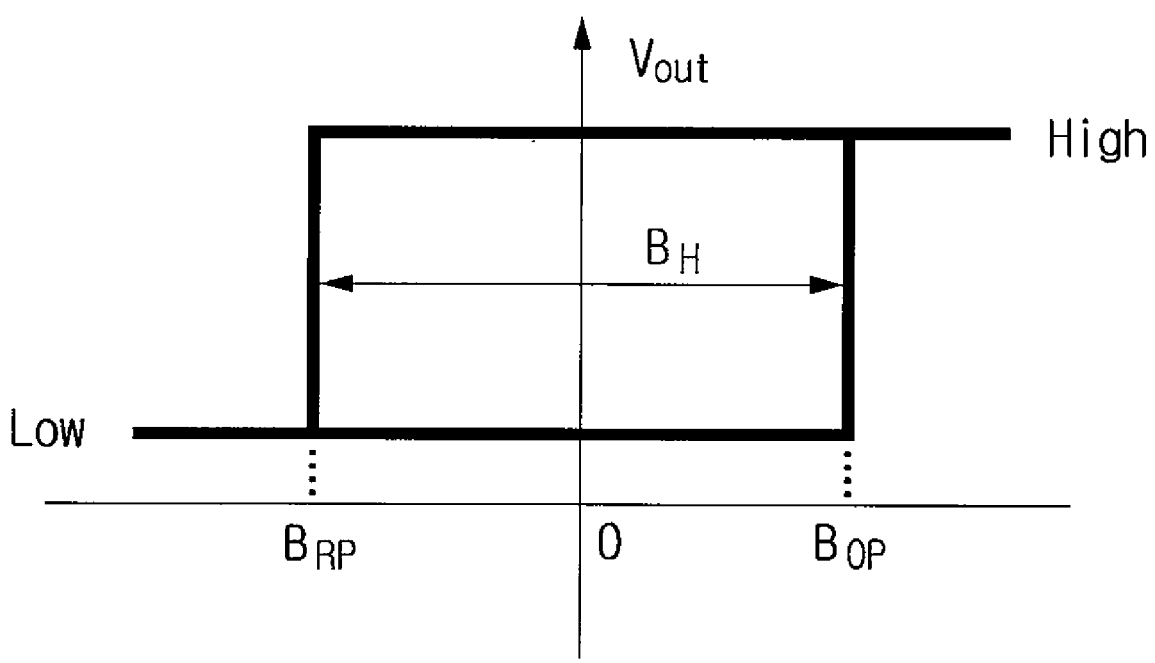
FIG. 13 is a graph illustrating a hysteresis loop of the Hall integrated circuit with adjustable hysteresis shown in FIG. 1.

FIG. 13 is a graph illustrating a hysteresis loop of the Hall integrated circuit with adjustable hysteresis shown in FIG. 1.

As illustrated in FIG. 13, the Hall integrated circuit with adjustable hysteresis in accordance with an embodiment of the present invention can output high when the magnetic flux density exceeds a first set value $B_{OP}$ and low when the magnetic flux density is less than or equal to a second set value $B_{RP}$. Although the example shown in FIG. 13 presents that the first set value $B_{OP}$ is set to be positive and the second set value $B_{RP}$ is set to be negative, the present invention is not limited to this example, and it is also possible that the first set value $B_{OP}$ and the second set value $B_{RP}$ can have a positive value or a negative value.

Also, the absolute values of the first set value $B_{OP}$ and the second set value $B_{RP}$ can be similar within a predetermined range.

As described above, the Hall integrated circuit with adjustable hysteresis in accordance with an embodiment of the present invention can realize a bipolar characteristic, which is not affected by changes in temperature, production environment and process or other environmental factors, since the circuit is implemented as a digital circuit.

The Hall integrated circuit with adjustable hysteresis in accordance with an embodiment of the present invention can be utilized in sensors of devices such as mobile phones and automobiles.

While the spirit of the invention has been described in detail with reference to a certain embodiment, the embodiment is for illustrative purposes only and shall not limit the invention. It is to be appreciated that those skilled in the art can change or modify the embodiment without departing from the scope and spirit of the invention.

What is claimed is:

1. A Hall integrated circuit with adjustable hysteresis comprising:
    a magnetic field-pulse convertor configured to output a pulse-shaped voltage difference pulse by converting a change in two voltages as a pulse, the change occurring in accordance with a magnitude of a magnetic field inputted by a Hall sensor;
    a polarity determining unit configured to determine polarities of two signals outputted by the Hall sensor by using the voltage difference pulse and one of the two signals outputted by the Hall sensor;
    a magnetic flux density determining unit configured to output a high signal or a low signal by comparing the voltage difference pulse with a set value; and
    a first flip-flop configured to output a result signal having a hysteresis characteristic according to inputs by the polarity determining unit and the magnetic flux density determining unit.

2. The Hall integrated circuit with adjustable hysteresis of claim 1, further comprising a clock generator configured to generate a clock signal, the clock signal being supplied to at least one of the magnetic field-pulse convertor, the polarity determining unit and the magnetic flux density determining unit.

3. The Hall integrated circuit with adjustable hysteresis of claim 2, wherein the magnetic field-pulse convertor further comprises:
    a first voltage output unit configured to output a voltage signal by using the clock signal and a first signal outputted by the Hall sensor, the voltage signal being charged in a first capacitor;
    a second voltage output unit configured to output a voltage signal by using the clock signal and a second signal outputted by the Hall sensor, the voltage signal being charged in a second capacitor; and
    an XOR gate unit configured to output the voltage signals inputted by the first voltage output unit and the second voltage output unit through an exclusive logical combination.

4. The Hall integrated circuit with adjustable hysteresis of claim 3, wherein the XOR gate unit outputs high during an input time difference between the voltage outputted by the first voltage output unit and the voltage outputted by the second voltage output unit.

5. The Hall integrated circuit with adjustable hysteresis of claim 3, wherein the polarity determining unit further comprises:
    an AND gate configured to perform an AND operation using the voltage outputted by the first voltage output unit and the voltage difference pulse; and
    a second flip-flop configured to output a pulse having polarity information by receiving a signal outputted by the AND gate and a clock bar signal, the clock signal being inverted to the clock bar signal.

6. The Hall integrated circuit with adjustable hysteresis of claim 1, wherein the magnetic flux density determining unit further comprises:
    a counter configured to count the number of clocks of a reference clock signal within a pulsewidth of the voltage difference pulse by receiving the voltage difference pulse and the reference clock signal; and
    a comparator configured to output a high signal or a low signal by comparing the number of counted clocks with the set value.

7. The Hall integrated circuit with adjustable hysteresis of claim 6, wherein the magnetic flux density determining unit further comprises a delay unit configured to extend and output the pulsewidth of the voltage difference pulse if the pulsewidth of the voltage difference pulse is narrower than or equal to that of the reference clock signal.

8. The Hall integrated circuit with adjustable hysteresis of claim 6, wherein the set value has a first set value having an upper limit and a second set value having a lower limit.

9. The Hall integrated circuit with adjustable hysteresis of claim 8, wherein the first set value and the second set value have a same absolute value and have opposite polarities.

10. The Hall integrated circuit with adjustable hysteresis of claim 6, wherein an absolute value of the set value is selected within a predetermined range.

11. The Hall integrated circuit with adjustable hysteresis of claim 1, further comprising an amplifier configured to amplify the signals outputted by the Hall sensor.

* * * * *